United States Patent [19]

Carlson et al.

[11] Patent Number: 4,649,497

[45] Date of Patent: Mar. 10, 1987

[54] COMPUTER-PRODUCED CIRCUIT BOARD

[75] Inventors: Alden J. Carlson, Bothell; Kasi S. Bhaskar, Seattle, both of Wash.

[73] Assignee: John Fluke Mfg. Co., Inc., Everett, Wash.

[21] Appl. No.: 500,816

[22] Filed: Jun. 3, 1983

[51] Int. Cl.$^4$ .......................... G06F 15/60; G01D 9/42
[52] U.S. Cl. ........................................ 364/491; 29/846; 219/121 L; 346/108
[58] Field of Search ................. 29/846, 848, 852, 853; 364/489, 490, 491, 488; 174/68.5; 358/296; 346/108; 219/121 L, 121 LM, 121 LN, 121 LJ, 121 LG

[56] References Cited

U.S. PATENT DOCUMENTS

| | | | |
|---|---|---|---|
| 3,932,932 | 9/1974 | Goodman | 29/852 |
| 4,211,603 | 7/1980 | Reed | 174/68.5 X |
| 4,253,231 | 3/1981 | Nouet | 29/841 X |
| 4,325,780 | 4/1982 | Schulz, Sr. | 174/68.5 X |
| 4,338,508 | 7/1982 | Jones et al. | 219/121 LJ |
| 4,346,987 | 8/1982 | Jalichandra et al. | 355/40 |
| 4,354,196 | 10/1982 | Neumann et al. | 358/296 X |
| 4,358,659 | 11/1982 | Spohnheimer | 219/121 LG X |
| 4,374,457 | 2/1983 | Wiech, Jr. | 361/382 X |
| 4,377,849 | 3/1983 | Finger et al. | 364/491 |
| 4,392,362 | 7/1983 | Little | 29/157.3 D X |
| 4,392,909 | 7/1983 | Bohn et al. | 174/68.5 X |
| 4,404,569 | 9/1983 | Neumann et al. | 358/296 X |
| 4,411,982 | 10/1983 | Shibuya et al. | 29/846 X |
| 4,417,297 | 11/1983 | Oyama et al. | 361/414 X |
| 4,417,393 | 11/1983 | Becker | 29/849 X |
| 4,419,675 | 12/1983 | Neumann et al. | 346/108 |
| 4,424,519 | 1/1984 | Neumann et al. | 358/296 X |
| 4,504,607 | 3/1985 | Leech | 525/476 X |
| 4,521,262 | 6/1985 | Pellegrino | 29/852 X |

FOREIGN PATENT DOCUMENTS 0047388  3/1982  European Pat. Off. ............ 364/550

OTHER PUBLICATIONS

Electro Scientific Industries: ESI Model 44 Laser Trimming System Catalog, 1982.
Chandler: Design for Numerical Control Machining, Machine Design Feb. 15, 1968, pp. 158–178.
PCB System (Advertisement), Product Design and Development, Mar. 1986, p. 45.

Primary Examiner—Felix D. Gruber
Attorney, Agent, or Firm—Mikio Ishimaru; Steven A. Becker; Benjamin J. Hauptman

[57] ABSTRACT

A method of manufacturing a circuit board from a copper clad board comprises the steps of designing a circuit configuration of the circuit board on a computer-aided design system and then determining a desired circuit configuration outline on the computer-aided design system from the circuit configuration. The desired circuit configuration outline is provided to a computer-aided machining system which controls a laser, milling machine and the like to remove conductive material along the outline, leaving conductive material formed adjacent the removed material as the circuit configuration.

12 Claims, 3 Drawing Figures

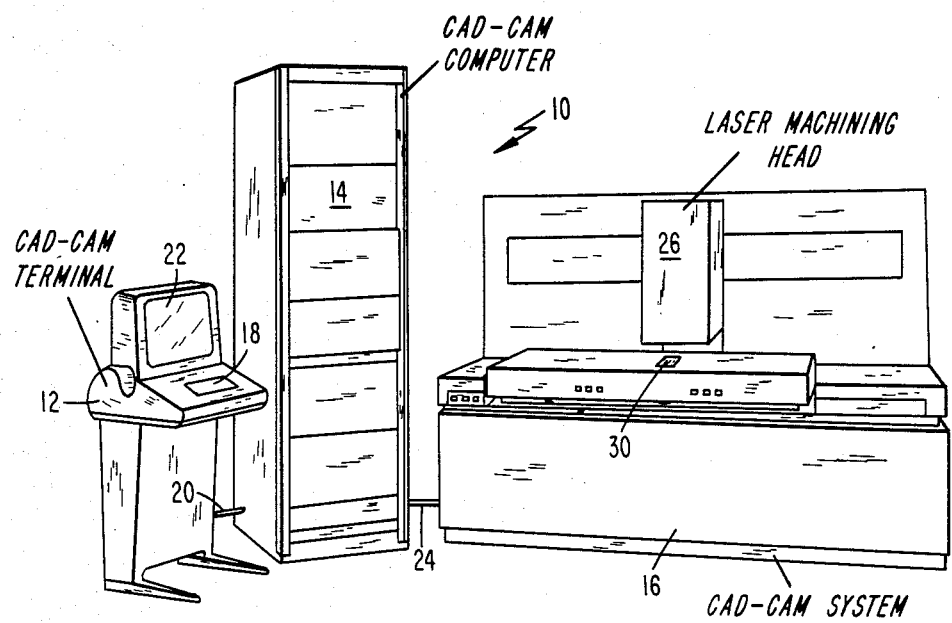
Fig. 1
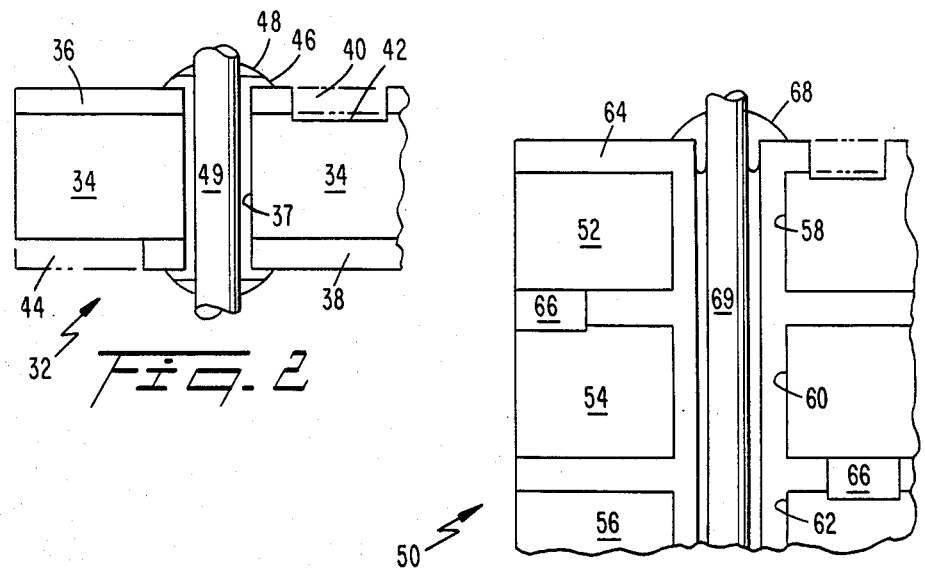
Fig. 2
Fig. 3

COMPUTER-PRODUCED CIRCUIT BOARD

FIELD OF THE INVENTION

The present invention relates generally to the manufacture of electronic circuit boards and more particularly to computer-produced electronic circuit boards.

BACKGROUND OF THE INVENTION

When the printed circuit board was first developed, it was hailed as a major advance in electronics technology over production hard wired boards. The printed circuit board permitted more components to be mounted in a smaller area than previously possible and has rendered the hard wired board obsolete. As the technology evolved, the distance between circuit lines has shrunk and multi-layered boards have been developed.

The density and complexity of printed circuit boards can no longer be matched by hard wired boards. Therefore, even in prototyping a new electronic board, it is often necessary to use substantially the same steps and procedures as would be used for a production printed circuit board.

While there are a number of minor variations, there are generally four steps in producing a printed circuit board. First, the printed circuit board is laid out using a computer aided design (CAD) system. Second, the output of the CAD system is used to provide a pattern image which is a negative of the desired circuit pattern. Third, this negative is then used in a photochemical fabrication process which involves a large number of chemical steps (sometimes as many as fifty-five) to produce the finished circuit pattern. Fourth, a mechanical fabrication process is required to provide through-holes for later connection of components or circuits an opposite sides of the board, and for trimming the board to its final configuration.

In complex, multi-layered boards, an additional mechanical fabrication process is added during mechanical fabrication to bond a number of boards together under high pressure.

Unfortunately, it generally takes weeks and even months to develop a prototype board and place it into production. The state of the art is such that a prototype board may be completed in five to seven days on an expedited basis using totally automated equipment.

Projections have been made that with the most sophisticated automation technology available, the most optimistic idea-to-product time may be three days.

As would be evident, because of the complexity of the boards, there is a vital need to be able to obtain prototype boards as quickly as possible to detect problems and errors and to test out the corrections.

Another problem is that customers are demanding smaller and more individualized electronic products. This means more and more customized boards are required for production runs which are getting shorter. Unfortunately, with customization, the economies of volume production are lost and the end products tend to become relatively expensive.

Thus, the ideal method of manufacturing printed circuit boards should be as rapid as possible while being economical on a small production line basis. Further, the end product would ideally be interchangeable with mass-produced printed circuit boards in order to assure a high degree of confidence that the prototype board will correctly emulate the production boards.

SUMMARY OF THE INVENTION

The present invention provides a manufacturing process for computer-produced circuit boards which would allow the production of a prototype board within only a few minutes after the design has been completed.

The present invention further provides a manufacturing method for providing computer-produced circuit boards for small-volume or customized production which would require at most only a few hours of production time per board.

The present invention further provides a computer-produced circuit board which would be directly interchangeable with a conventional printed circuit board.

The present invention further provides a computer controlled system which may be used with many different computer aided manufacturing (CAM) systems.

The present invention further provides a method of manufacturing computer-produced circuit boards using conventional machining processes which require a minimal number of chemical processing steps or none at all.

A further advantage of the present invention is that no washing and drying operations are required so there will be a minimum number of contaminants and there will be no ions remaining from chemical processes to require deionization of the circuit board.

The above additional advantages of the present invention will become apparent to those skilled in the art from a reading of the following detailed description when taken in conjunction with the accompanying drawings.

BRIEF DESCRIPTION OF THE DRAWINGS

FIG. 1 is an example of the design and manufacturing equipment required to provide a computer-produced circuit board manufactured in accordance with the present invention;

FIG. 2 is a sectional view of a portion of a single layer computer-produced circuit board; and FIG. 3 is a sectional view of a portion of a multi-layer computer-produced circuit board.

DESCRIPTION OF THE PREFERRED EMBODIMENTS

Referring now to FIG. 1, therein as shown an example of a computer-produced circuit board (CPCB) design and manufacturing system 10. Although many different system configurations are possible and would be evident to those skilled in the art from this Description, for purposes of illustration, the system 10 includes a computer aided design(CAD)/computer aided manufacturing (CAM) terminal 12, a CAD/CAM computer 14, and a CAM system 16.

The CAD terminal 12 includes a keyboard 18 for providing instructions and data to the CAD/CAM computer 14 via a connection 20. For reviewing the design, a viewing screen 22 is part of the CAD terminal 12.

The CAD/CAM computer 14 is shown as a single unit although they may be separate systems available from many different manufacturers. The CAD/CAM computer 14 is connected by a connection 24 to the CAM system 16. Information developed on the computer 14 can optionally be transported to the CAM system 16 on standard commercial magnetic media.

The CAM system 16 is shown having a computer controlled laser machining head 26 for providing laser energy to a CPCB 30.

The CAM system 16 also represents a variety of other systems which could include mechanical material removal systems (such as drills, routers, mills, grinders, sand blasters, etc.) and/or chemical processing equipment.

In operation, an operator would input the required design parameters of the CPCB 30 at the CAD terminal 12 through the keyboard 18. The information would be processed using conventional CAD software and the CAD/CAM computer 14, and the results would be viewable on the view screen 22.

When the operator is satisfied as to the design, the design will be provided to the CAM software in the CAD/CAM computer 14 to cause the CAM system 16 to machine the CPCB 30.

Following the instructions from the CAD/CAM computer 14, a board coated with conductive material will be subjected to a material removal technique which would remove all of the conductive material down to the bare board from those areas lying outside of the desired circuit areas. Optionally, the desired circuit areas need only to be electrically isolated from the undesired areas by a narrow "cut" on each side of the desired circuit areas. This will leave the conductive material separated by areas that are bared down to the nonconductive base.

In the preferred embodiment, the CPCB starting stock is a polymer and/or glass board fully clad on top and bottom with surface-oxidized copper. Being black, the oxidized copper is easily removed by exposure to a laser beam. The laser in the machining head 26 is guided by the computer 14 to outline the desired conductor areas. For example, two parallel laser machined cuts define each circuit line. Where desired, the laser could burn or vaporise component holes through the CPCB 30.

After the lasing operation for both sides, the CAM system 16 exposes the CPCB 30 to a reducing atmosphere to return the copper oxide to shiny copper to provide the completed circuit board.

In an alternate embodiment, graphite could be bonded to the polymer board to be lased away, and chemical processes used to later replace the graphite with a conductive material such as copper.

In a further alternate embodiment, the CAM system 16 would include mechanical material removal machines such as a sand blaster or routing machine or chemical apparatus such as an acid ink jet printer to outline the conductive areas. Once the circuit lines were provided, a subsequent drilling process would be utilized to provide the through-holes required to connect the circuit pattern on the two sides in a subsequent operation employing solder or rivets and to allow insertion of the electronic components.

In its most advanced form, the system 10 may also manufacture the CPCB starting stock by molding the board base to size with the component holes included from polymer material by molding the polymer material. As an alternative, the system 10 would cut sheet stock to size for later drilling of the holes. The system 10 would also include copper coating equipment such as sputtering apparatus to coat the board base. These operations would produce the CPCB starting stock which then would undergo conductor-removal as previously described.

With an alternate embodiment of the most advanced form, a polymer board is provided with through-holes during the molding process or predrilled in a predetermined configuration as the first stage of manufacture. The board may then be coated with a conductive material such as chromium or copper by a process which would provide the conductive material in the through-holes. Sputtering is one example of such a process. The conductive coatings are thickened using chemical copper plating processes. This pre-prepared board would then be subjected to the material removal process described previously.

The base board may be made of any nonconductive material and the cladding may be of any conductive material attachable to the base board. A laser-removal operation would take less than a minute for simple boards while sand blasting, milling, or other mechanical removal methods would take several minutes.

In a further alternate embodiment, it will be evident to those skilled in the art that a computer-controlled acid ink jet technique could also be used to accomplish the removal operation.

A further advantage of the present invention is that where no washing and drying operations are required as in the present invention, there will be a minimum number of contaminants and there will be no ions remaining from the various chemical proecesses to require ionization of the circuit board.

Referring now to FIG. 2, therein is shown a cross-section of a portion of a single-layer CPCB 32. The CPCB 32 consists of polymer/glass base board 34 covered with pads and/or circuit lines 36 and 38 of copper sputtered onto the respective top and bottom of the base board 34.

As shown at the top, a mechanical removal technique will remove conductive material 40 as well as base material 42 as shown by the respective upper and lower phantom lines. On the bottom side of the board of FIG. 2, a laser process has been used which only removes conductive material 44 to leave the circuit line 38 since the laser beam will be reflected off the base board 34.

In order to connect circuit lines 36 and 38 on the top and bottom respectively, through the nonconductive base board 34, a computer controlled riveting operation is used to place the rivet 46 into the proper location in a hole 37 and crimp it into position conductively connecting the top and bottom circuit lines 36 and 38 of the CPCB 32. Once the rivet is in place, a computer controlled wave soldering operating could be used to apply the solder 48 to hold a component lead 49 in place on the CPCB 32.

For prototype boards, when time is critical and labor costs not as important, the through-hole connection may be achieved by dispensing with the rivet 46 and soldering the component lead 49 carefully into place in conductive connection with the circuit lines 36 and 38 on both sides of the board.

Referring now to FIG. 3, therein is shown a cross-section of a portion of a multi-layer CPCB 50. The CPCB 50 consists of a plurality of polymer/glass base boards 52, 54, and 56 having respective through holes 58, 60, and 62. The surfaces of the boards and the through holes are covered with copper 64 and the areas not covered are coated with a bonding material 66. Inserted through the holes is a component wire 69 which is held in place by solder 68.

The CPCB 50 is produced by covering the individual boards 52, 54, and 56 on one or both sides as desired by a sputtering process; removing the copper 64 mechanically; depositing additional copper chemically; placing the bonding material on the boards; and laminating the boards together under heat and pressure.

As many other possible embodiments, singularly or in combination, may be made of the present invention without departing from the scope thereof, it is to be understood that all matters set forth herein or shown in the accompanying drawings are to be interpreted in an illustrative and not a limiting sense.

I claim:

1. A method a manufacturing a circuit board using a computer system, comprising:
    (a) designing a circuit configuration of the circuit board on a computer aided design system;
    (b) determining a desired circuit configuration outline on said computer aided design system from said circuit configuration and providing the desired circuit configuration outline to a computer aided machining system; and
    (c) removing conductive material along the outline to leave conductive material formed adjacent the removal material as the circuit configuration under the guidance of said computer aided machining system from a conductive material covered, nonconductive board.

2. The method as claimed in claim 1 wherein said designing step includes inputting component locations and interconnection information to said computer aided design system.

3. The method as claimed in claim 1 wherein said removing step includes sand blasting.

4. The method as claimed in claim 1 wherein said removing step includes laser machining.

5. The method as claimed in claim 1 wherein said removing step includes routing.

6. The method as claimed in claim 1 wherein said removing step includes milling.

7. The method as claimed in claim 1 wherein said removing step includes chemical machining.

8. A method of manufacturing a circuit board using a computer system, comprising:
    (a) forming a nonconductive board base using a forming process controlled by the computer system;
    (b) coating said base with a conductive material using a coating process controlled by the computer system; and
    (c) removing portions of said conductive material along a desired outline of circuit lines using a material removal tool guided by the computer system to remove from the base the conductive material portions along the desired outline.

9. The method as claimed in claim 8 where said forming step includes plastic molding of said base.

10. The method as claimed in claim 8 where said forming step includes cutting.

11. The method as claimed in claim 8 wherein said coating step includes chemical deposition.

12. The method as claimed in claim 8 where said coating step includes sputtering.

* * * * *